United States Patent
Li et al.

(10) Patent No.: US 12,166,469 B2
(45) Date of Patent: Dec. 10, 2024

(54) CAVITY STRUCTURE OF BULK ACOUSTIC RESONATOR, AND MANUFACTURING PROCESS

(71) Applicant: JWL (ZHEJIANG) SEMICONDUCTOR CO., LTD, Zhejiang (CN)

(72) Inventors: Linping Li, Zhejiang (CN); Jinghao Sheng, Zhejiang (CN); Zhou Jiang, Zhejiang (CN)

(73) Assignee: JWL (ZHEJIANG) SEMICONDUCTOR CO., LTD (CN)

( * ) Notice: Subject to any disclaimer, the term of this patent is extended or adjusted under 35 U.S.C. 154(b) by 0 days.

(21) Appl. No.: 18/002,678

(22) PCT Filed: Jun. 29, 2020

(86) PCT No.: PCT/CN2020/098696
§ 371 (c)(1),
(2) Date: Dec. 21, 2022

(87) PCT Pub. No.: WO2022/000153
PCT Pub. Date: Jan. 6, 2022

(65) Prior Publication Data
US 2023/0238933 A1 Jul. 27, 2023

(30) Foreign Application Priority Data
Jun. 28, 2020 (CN) .......................... 202010595466.6

(51) Int. Cl.
*H03H 9/17* (2006.01)
*H03H 3/02* (2006.01)

(52) U.S. Cl.
CPC ....... *H03H 9/174* (2013.01); *H03H 2003/023* (2013.01)

(58) Field of Classification Search
CPC .......................... H03H 9/174; H03H 2003/023
See application file for complete search history.

(56) References Cited

U.S. PATENT DOCUMENTS 5,185,550 A 2/1993 Morita et al.
5,801,069 A * 9/1998 Harada .................. H03H 9/174
438/52

(Continued)

FOREIGN PATENT DOCUMENTS

CN 108964631 A 12/2018
CN 109802649 A 5/2019

(Continued)

OTHER PUBLICATIONS

Office Action issued in counterpart Korean Application No. 10-2023-7002050 on Sep. 14, 2023.

(Continued)

*Primary Examiner* — Samuel S Outten
(74) *Attorney, Agent, or Firm* — The Belles Group, P.C.

(57) ABSTRACT

A cavity structure of a bulk acoustic resonator and a manufacturing process. The cavity structure comprises a substrate and a cavity formed on the substrate, a support layer is arranged on the substrate to form the cavity in a surrounding manner, a release channel in communication with the cavity is formed above the substrate in a same layer with the cavity, and the release channel extends, in parallel to the substrate, in a peripheral area of the cavity. There is no need to manufacture a release hole, which simplifies the manufacturing process of the resonator, thereby avoiding weakening the performance of the resonator due to damage to the structure of the piezoelectric layer around the electrode layer when manufacturing the release hole.

12 Claims, 7 Drawing Sheets

(56) References Cited

U.S. PATENT DOCUMENTS

| | | | | |
|---|---|---|---|---|
| 2005/0110369 A1* | 5/2005 | Onishi | ................... | H03H 9/588 |
| | | | | 310/320 |
| 2010/0019866 A1* | 1/2010 | Hara | ..................... | H03H 9/205 |
| | | | | 29/25.35 |
| 2018/0013401 A1 | 1/2018 | Lee et al. | | |
| 2018/0337650 A1 | 11/2018 | Lee et al. | | |

FOREIGN PATENT DOCUMENTS

| | | | |
|---|---|---|---|
| CN | 110350885 A | | 10/2019 |
| CN | 110995196 A | | 4/2020 |
| CN | 111010109 | * | 4/2020 |
| CN | 111010109 A | | 4/2020 |
| CN | 111342799 A | | 6/2020 |
| CN | 111342809 A | | 6/2020 |
| JP | 2006019935 | | 1/2006 |
| JP | 2006229611 | | 8/2006 |
| JP | 2010109950 | | 5/2010 |
| JP | 2011077810 A | | 4/2011 |
| JP | 2018007230 A | | 1/2018 |

OTHER PUBLICATIONS

Search Report issued in counterpart European Application No. 20943204.6 on Oct. 20, 2023.
Office Action issued in counterpart Japanese Application No. 2022-580338 on Jan. 16, 2024.

* cited by examiner

CAVITY STRUCTURE OF BULK ACOUSTIC RESONATOR, AND MANUFACTURING PROCESS

CROSS-REFERENCE TO RELATED PATENT APPLICATIONS

This application is the national phase of International Application No. PCT/CN2020/098696, titled "CAVITY STRUCTURE OF BULK ACOUSTIC RESONATOR, AND MANUFACTURING PROCESS", filed on Jun. 29, 2020, which claims the priority to Chinese Patent Application No. 202010595466.6 titled "CAVITY STRUCTURE OF BULK ACOUSTIC RESONATOR, AND MANUFACTURING PROCESS", filed on Jun. 28, 2020 with the China National Intellectual Property Administration. The disclosures of the aforementioned priority applications are incorporated herein by reference in their entireties.

FIELD

The present disclosure relates to the field of communication devices, and in particular, to a cavity structure of a bulk acoustic resonator and a manufacturing process.

BACKGROUND

With the increasingly crowded electromagnetic spectrum and the increase in frequency bands and functions of wireless communication devices, the electromagnetic spectrum used in wireless communication has increased rapidly from 500 MHz to 5 GHz or more, and the requirements for high performance, low cost, low power consumption and small size of radio frequency front-end modules has increased increasingly. A filter, as one of the radio frequency front-end modules, can improve transmitting and receiving signals, and is mainly formed by multiple resonators connected by a topological network structure. Fbar (Thin film bulk acoustic resonator) is a bulk acoustic resonator, and a filter including Fbar is used as a core device at a radio frequency front end due to the advantages of small size, strong integration ability, high quality factor Q at high frequency operation, and strong power tolerance.

Fbar has a basic structure including upper and lower electrodes and a piezoelectric layer sandwiched therebetween. The piezoelectric layer can realize the conversion of electrical energy and mechanical energy. When an electric field is applied to the upper and lower electrodes, the piezoelectric layer converts the electrical energy into the mechanical energy, which macroscopically exists in a form of sound waves. The sound waves are reflected back and forth between the upper and lower electrodes to form oscillations, the oscillated sound waves excite radio frequency signals, and thus the mechanical energy is converted into the electrical energy. Therefore, bulk sound waves mainly occur in the piezoelectric layer, and the attributes of the piezoelectric layer affect the performance of the resonator. As shown in FIG. 1, a stress change of a material of the piezoelectric layer leads to a change in electromechanical coupling coefficient of the piezoelectric layer, and a bandwidth of the filter including the resonator changes, thereby leading to the difference in the performance of a device. Therefore, the control for the stress is very critical. The stress of the piezoelectric layer may be affected during the releasing of a cavity.

In the conventional technology, the performance of the resonator is weakened due to the manufacturing of a release hole damaging the stress uniformity of the piezoelectric layer. The cavity of some resonators is manufactured by digging a groove on a substrate and releasing a sacrificial layer, which has a "concave" type structure relative to the substrate. Thus, it is required to manufacture a release hole on the electrode layer and the piezoelectric layer for releasing the sacrificial layer, which affects the stress change of the piezoelectric layer. In addition, a release hole may be manufactured in the periphery of the inner side of the cavity to release the cavity. However, the release hole damages a peripheral piezoelectric layer structure above the cavity. Further, since a material of a support layer of the cavity of the resonator structure is SiN, it is required to use Si with a high selection ratio to manufacture the sacrificial layer. When the cavity is further released, the alkaline Si release liquid in a wet process easily damages the piezoelectric layer.

In view of this, it is very significant to design a new type of cavity structure to solve the problem of damaging the stress uniformity of the piezoelectric layer due to the manufacturing of the release hole.

SUMMARY

In view of the above problem that the performance of the resonator is weakened in a case of damaging the stress uniformity of the piezoelectric layer due to the manufacturing of the release hole for a conventional bulk acoustic resonator structure, a cavity structure of a bulk acoustic resonator and a process for manufacturing the same are provided according to the present disclosure to solve the above problem.

In a first aspect, a cavity structure of a bulk acoustic resonator is provided according to an embodiment of the present disclosure. The cavity structure includes a substrate and a cavity formed on the substrate, where, a support layer is arranged on the substrate to form the cavity in a surrounding manner, a release channel in communication with the cavity is formed above the substrate in a same layer with the cavity, and the release channel extends, in parallel to the substrate, in a peripheral area of the cavity.

In some embodiments, the release channel includes a first release channel extending outward from the cavity and a second release channel extending among cavities of multiple resonators to be in communication with the first release channel. The first release channel and the second release channel are criss-crossed around the cavities of the resonator to ensure that a release liquid can flow from the first release channel and the second release channel into the cavities to quickly sacrifice the sacrificial material and to ensure that the stress uniformity of the piezoelectric layer is not affected. The criss-crossed release channels may be designed based on the distribution of the resonators, thereby eliminating the need to manufacture the release hole and simplifying the process for manufacturing the resonator.

In some embodiments, a projection of the first release channel and/or the second release channel on the substrate is of a shape of a trapezoid, an arc or a rectangle. By changing the shape of the first release channel and/or second release channel around the electrode layer, the stress of the piezoelectric layer covering on the first release channel and/or second release channel is thereby adjusted and the performance of the resonator can be effectively improved.

In some embodiments, a groove in communication with the release channel is formed on the substrate in a peripheral area of a filter formed by multiple resonators being connected. The groove allows all the release channels to be communicated, thereby avoiding weakening the performance of the resonator due to damage to the structure of the piezoelectric layer around the electrode layer when manufacturing a release hole (a hole in an AlN film layer).

In some embodiments, the groove is a channel without a film covering on top. The release liquid may be injected directly from the groove and then circulated into the cavity from inside the release channel.

In a second aspect, a bulk acoustic resonator is further provided according to an embodiment of the present disclosure. The resonator includes a bottom electrode layer, a piezoelectric layer and a top electrode layer sequentially stacked and formed above a cavity, where the bottom electrode layer is spanned on the support layer, and the bulk acoustic resonator further includes the cavity structure according to the first aspect.

In some embodiments, the release channel is a channel extends between the substrate and the piezoelectric layer. The release channel extends between the substrate and the piezoelectric layer, and the cavity is formed on the substrate, so that the release liquid can flow through the release channel and the cavity due to the fluidity.

In some embodiments, a release hole is arranged in an area away from the bottom electrode layer and the top electrode layer of the resonator, and the release hole is in communication with at least one of the release channel. The release hole can improve the efficiency of the release of the cavity, allowing the cavity to be released more quickly, without affecting the stress on the piezoelectric layer around the electrode layer in an area away from the bottom electrode layer and the top electrode layer of the resonator.

In a third aspect, a process for manufacturing a cavity structure of a bulk acoustic resonator is further provided according to an embodiment of the present disclosure. The process includes the following steps:

S1, manufacturing a patterned support layer on a substrate to form a cavity surrounded by the support layer, and forming, above the substrate, a release channel in communication with the cavity in a same layer with the cavity, where the release channel extends, in parallel to the substrate, in a peripheral area of the cavity;

S2, filling the cavity and the release channel with a sacrificial material;

S3, manufacturing a bottom electrode layer on the support layer and the sacrificial material, where the bottom electrode layer is spanned on the support layer and covers the cavity;

S4, manufacturing a piezoelectric layer and a top electrode layer on the bottom electrode layer; and S5, removing the sacrificial material.

In some embodiments, the release channel includes a first release channel extending outward from the cavity and a second release channel extending among cavities of multiple resonators to be in communication with the first release channel.

In some embodiments, a projection of the first release channel and/or the second release channel on the substrate is of a shape of a trapezoid, an arc or a rectangle. By changing the shape of the first release channel and/or second release channel around the electrode layer, the stress of the piezoelectric layer covering on the first release channel and/or second release channel is thereby adjusted and the performance of the resonator can be effectively improved.

In some embodiments, the step S1 further includes: patterning the substrate in a peripheral area of a filter formed by multiple resonators being connected, to form a groove in communication with the release channel. The groove allows all the release channels to be communicated, thereby avoiding weakening the performance of the resonator due to damage to the structure of the piezoelectric layer around the electrode layer when manufacturing a release hole (a hole in an AlN film layer).

In some embodiments, the step S2 further includes: filling the groove with the sacrificial material. The groove is formed in a same step with the release channel and the cavity, and the groove is filled with the sacrificial material at the same time, thus simplifying the manufacturing process and allowing the groove, the release channel and the cavity to be filled by filling the sacrificial material once.

In some embodiments, the step S1 further includes: depositing the support layer on the substrate through a PVD process, and patterning the support layer through photolithography and etching processes. Si may serve as the material for the support layer. The support layer is deposited on top of the substrate to pattern the groove, the release channel and the cavity by the above processes.

In some embodiments, the step S1 further includes: forming a patterned support layer on the substrate through an etching process. The process is simplified by etching directly onto the substrate to pattern the groove, the release channel and the cavity, eliminating the need for a deposition process.

In some embodiments, a surface of the sacrificial material and a surface of the support layer are made flush through a polishing step in the step S2. The polishing step includes chemical mechanical polishing, which flattens the surface of the sacrificial material and the surface of the support layer, thereby effectively reducing stress variations in the subsequent film layer and improving the mechanical stability.

In some embodiments, S5 further includes: manufacturing a release hole on the support layer and the piezoelectric layer in an area away from the bottom electrode layer and the top electrode layer of the resonator, where the release hole extends downward to the substrate and is in communication with at least one of the release channel. The release hole can improve the efficiency of the release of the cavity, allowing the cavity to be released more quickly without affecting the stress on the piezoelectric layer around the electrode layer in an area away from the bottom electrode layer and the top electrode layer of the resonator.

In some embodiments, the groove is a channel without a film covering on top, and the release channel is a channel extends between the substrate and the piezoelectric layer. The release liquid may be injected directly from the groove inside the release channel and circulated into the cavity.

A cavity structure of a bulk acoustic resonator and a process for manufacturing the same are disclosed in the present disclosure. By manufacturing, on the support layer, the release channel in communication with the cavity, the groove in communication with the release channel is arranged in a peripheral area of a filter formed by multiple resonators being connected, where the criss-crossed release channel may be designed based on the distribution of the resonators. In addition, there is no need to manufacture a release hole, which simplifies the manufacturing process of the resonator, thereby avoiding weakening the performance of the resonator due to damage to the structure of the piezoelectric layer around the electrode layer when manufacturing a release hole (a hole in an AlN film layer), The performance of the resonator can be improved by designing a shape of the release channel around the electrode layer and adjusting the stress of the piezoelectric layer around the electrode layer. Therefore, the cavity can be released without damaging the structure of the piezoelectric layer, and the stress of the piezoelectric layer can be adjusted through the design of the cavity structure. Electrodes electrically connected between the resonators are arranged on the support layer, the piezoelectric layer and the release channel. The stress of the electrode layer can be released to a certain extent by setting the release channel, so that electrical signals can be transmitted normally.

BRIEF DESCRIPTION OF THE DRAWINGS

The accompanying drawings are included to provide a further understanding of the embodiments and are incorporated into and constitute a part of the specification. The drawings illustrate embodiments and serve to explain the principles of the present disclosure together with the description. Other embodiments and many of the intended advantages of the embodiments will be readily recognized, and are better understood by reference to the following detailed description. The elements of the drawings are not necessarily to scale to each other. Like reference numerals designate corresponding similar parts.

DETAILED DESCRIPTION

Figure 1:
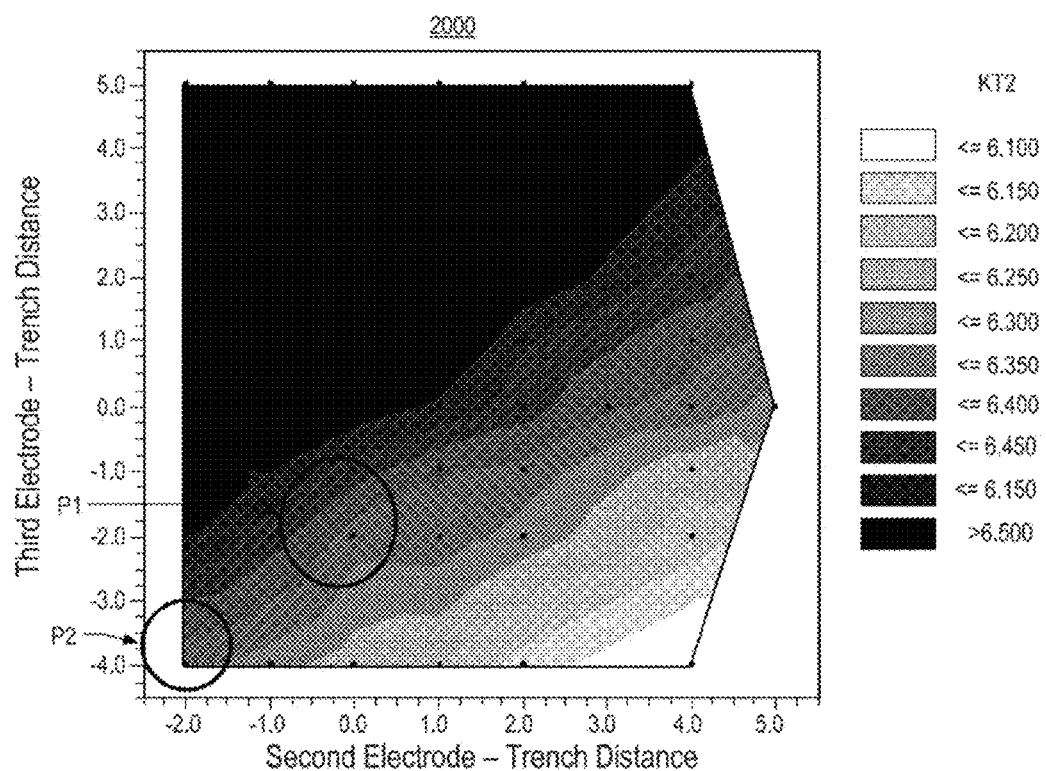
FIG. 1 shows a diagram illustrating the performance difference due to different stress in different areas of a piezoelectric film in the conventional technology.

The present disclosure will be further described in detail below with reference to the accompanying drawings and embodiments. It should be understood that the specific embodiments described herein are only used to explain the related content of the present disclosure, but not to limit the present disclosure. In addition, it should be noted that, for the convenience of description, only the parts related to the related content of the present disclosure are shown in the drawings. It should be noted that the dimensions and sizes of components in the drawings are not to scale and the size of some components may be highlighted for clarity.

It should be noted that the embodiments in the present disclosure and the features of the embodiments may be combined with each other without conflict. The present disclosure will be described in detail below with reference to the accompanying drawings and in conjunction with the embodiments.

Figure 2:
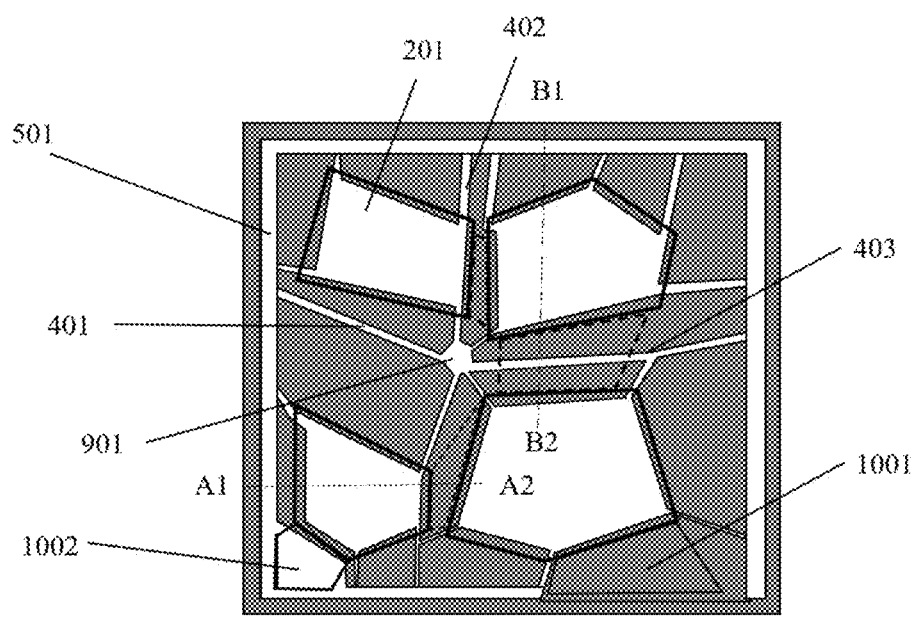
FIG. 2 shows a top view of a cavity structure of a hulk acoustic resonator and the bulk acoustic resonator according to an embodiment of the present disclosure.
Figure 3A:
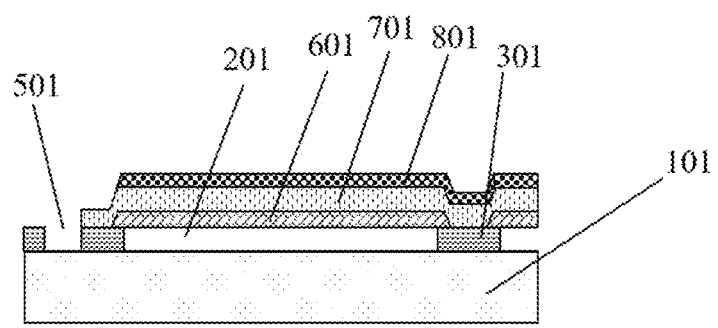
FIG. 3a and FIG. 3b show cross-sectional views of parallel or series connection of hulk acoustic resonators in a A1-A2 direction in FIG. 2 according to an embodiment of the present disclosure.

A cavity structure of a bulk acoustic resonator is provided according to an embodiment of the present disclosure. FIG. 2 is a top view of a bulk acoustic resonator. The cavity structure includes a substrate and a cavity 201 formed on the substrate. A support layer is arranged on the substrate to form the cavity 201 in a surrounding manner, a release channel 401 in communication with the cavity 201 is formed above the substrate in the same layer with the cavity 201, and the release channel 401 extends, in parallel to the substrate, in a peripheral area of the cavity 201. Correspondingly, a bulk acoustic resonator is further provided according to an embodiment of the present disclosure, as shown in FIG. 3a, the resonator includes a bottom electrode layer 601, a piezoelectric layer 701 and a top electrode layer 801 stacked in sequence and formed above the cavity 201, where the bottom electrode layer 601 is spanned on the support layer 301. The resonator further includes the above cavity structure. In a preferred embodiment, the material of the substrate 101 includes Si, SiC, sapphire, spinel, or the like, and the material of the support layer 301 includes Si. The release channel 401 criss-crossed in the peripheral area of the cavity 201 and in communication to the cavity 201 may be used to release the sacrificial material in the cavity 201 without affecting the stress of the piezoelectric layer 701 around the electrode layer of the resonator, thereby improving the performance of the resonator and avoiding weakening the performance of the resonator due to damage to the structure of the piezoelectric layer 701 around the electrode layer when manufacturing a release hole (a hole in an AlN film layer) in the conventional process. The release liquid for the sacrificial material may flow into the cavity 201 from the release channel 401 to release the cavity 201.

In a specific embodiment, the release channel 401 includes a first release channel 402 extending outward from the cavity 201 and a second release channel 403 extending among cavities 201 of multiple resonators to be in communication with the first release channel 402. The first release channel 402 and the second release channel 403 are criss-crossed around the cavities 201 of multiple resonators to ensure that the release liquid can flow from the first release channel 402 and the second release channel 403 into the cavity 201 to quickly sacrifice the sacrificial material and to ensure that the stress uniformity of the piezoelectric layer 701 is not affected. In a preferred embodiment, the criss-crossed release channels 401 may be designed based on the distribution of the resonators, thereby eliminating the need to manufacture the release hole and simplifying the process for manufacturing the resonator.

In a specific embodiment, a projection of the first release channel 402 and/or the second release channel 403 on the substrate 101 is of a shape of a trapezoid, an arc or a rectangle. The shape of the projection, when viewed from the top view, includes, but is not limited to, a trapezoid, an arc, or a rectangle. By changing the shape of the first release channel 402 and/or the second release channel 403 around the electrode layer, the stress of the piezoelectric layer 701 covering on the first release channel 402 and/or the second release channel 403 is adjusted, thereby effectively improving the performance of the resonator. Since the stress of the piezoelectric layer 701 around the electrode layer affects a resonance area above the cavity 201, the performance of the resonator can be improved by adjusting the stress of the piezoelectric layer 701 around the electrode layer.

In a specific embodiment, a filter is formed by multiple resonators being connected, and a groove 501 in communication with the release channel 401 is formed on the substrate 101 in a peripheral area of the filter. One end of all of the release channels 401 may be in communication to the groove 501, and the other end may be in communication to the cavity 201, thereby avoiding weakening the performance of the resonator due to damage to the structure of the piezoelectric layer 701 around the electrode layer when manufacturing a release hole (a hole in an AlN film layer).

In a preferred embodiment, the groove 501 is a channel without a film covering on top. The release liquid may be directly injected from the groove 501 and then circulated from the release channel 401 into the cavity 201. Therefore, in the present disclosure, it is not necessary to manufacture a release hole around the electrode layer, and the cavity 201 can be released by communicating the internal criss-crossed release channels 401 with the groove 501, In other embodiments, other methods other than the groove 501 may be selected to inject the release liquid into the release channel 401 to release the cavity 201.

In a specific embodiment, each of the release channel 401 is a channel extends between the substrate 101 and the piezoelectric layer 701. Different from the use of the release hole extending longitudinally through the electrode layer and the piezoelectric layer to the substrate in the conventional technology, the release channel 401 extends laterally between the substrate 101 and the piezoelectric layer 701, so that the release liquid can flow through the release channel 401. In addition, the cavity 201 is also formed on the substrate 101. In this case, the bottom surface of the release channel 401 and the bottom surface of the cavity 201 are flush, therefore, the release liquid can flow to the release channel 401 and the cavity 201 more quickly and conveniently through the fluidity.

In a specific embodiment, as shown in FIG. 2, a release hole 901 is arranged in an area away from the bottom electrode layer and the top electrode layer of the resonator, where the release hole 901 is in communication with at least one of the release channel 401. In terms of too many criss-crossed release channels 401, the release hole 901 is added, and a release efficiency of the cavity 201 can be improved by injecting the release liquid into the release hole 901, so that the cavity 201 can be released more quickly. In addition, the release hole 901 is formed in the area away from the bottom electrode layer and the top electrode layer of the resonator, which will not affect the stress of the piezoelectric layer around the electrode layer and not weaken the performance of the resonator. In a preferred embodiment, the distances between the release hole 901 and the bottom electrode layer and the top electrode layer of the resonator are equal to or greater than 5 µm. The release hole 901 manufactured at the distances will not affect the stress of the piezoelectric layer around the electrode layer.

In a specific embodiment, as shown in FIG. 2, a first electrode connection portion 1001 is arranged on the supporting layer and the piezoelectric layer around the resonator. The resonator may be electrically connected to the outside through the first electrode connection portion 1001. In this case, the top of the first electrode connection portion 1001 remains flush with the top of the resonator. In addition, a second electrode connection portion 1002 is arranged on the substrate around the resonator, and the second electrode connection portion 1002 extends from the piezoelectric layer 701 to the substrate in a stepped shape. The stepped second electrode connection portion 1002 makes the electrical connection with the outside more convenient, and can be positioned accurately at the stepped position during external connection, thereby improving the positioning accuracy. Moreover, the substrate under the second electrode connection portion 1002 is in communication with the substrate under the groove 501, and the supporting layer and the piezoelectric layer under the second electrode connection portion 1002 may be simultaneously etched to be formed at the same time with the groove 501. A ball mounting process may be performed on both the first connection portion 1001 and the second connection portion 1002 for subsequent device packaging. Electrodes electrically connected between the resonators are arranged on the support layer, the piezoelectric layer and the release channel. The stress of the electrode layer can be released to a certain extent by setting the release channel 401, so that electrical signals can be transmitted normally.

Figure 3B:
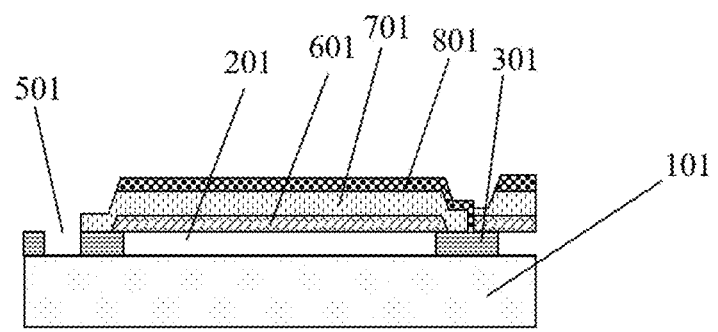
Figure 4A:
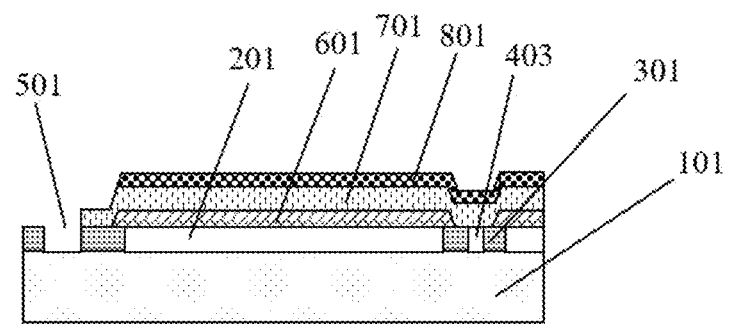
FIG. 4a and FIG. 4b show cross-sectional views of parallel or series connection of bulk acoustic resonators in a B1-B2 direction in FIG. 2 according to an embodiment of the present disclosure.
Figure 4B:
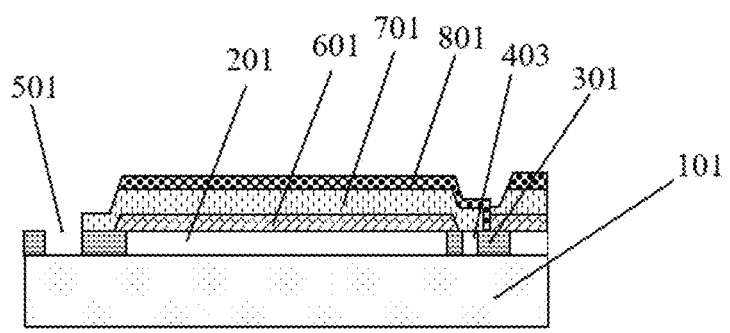

In a case that resonators are manufactured into an interconnected structure, when there is no release channel in a middle part where the two resonators are connected, cross-sectional views taken along A1-A2 as shown in FIG. 2 are shown in FIG. 3a and FIG. 3b, where FIG. 3a shows a case where the resonators are connected in parallel and FIG. 3b shows a case where the resonators are connected in series. As shown in FIG. 3a and FIG. 3b, the groove 501 and the cavity 201 are formed in the same layer. In a case that there is a release channel in the middle part where the two resonators are connected, cross-sectional views taken along B1-B2 as shown in FIG. 2 are shown in FIG. 4a and FIG. 4b, where FIG. 4a shows a case where the resonators are connected in parallel, and FIG. 4b shows a case where the resonators are connected in series. As shown in FIG. 4a and FIG. 4b, the groove 501, the cavity 201 and the second release channel 403 are formed in the same layer.

Figure 5:
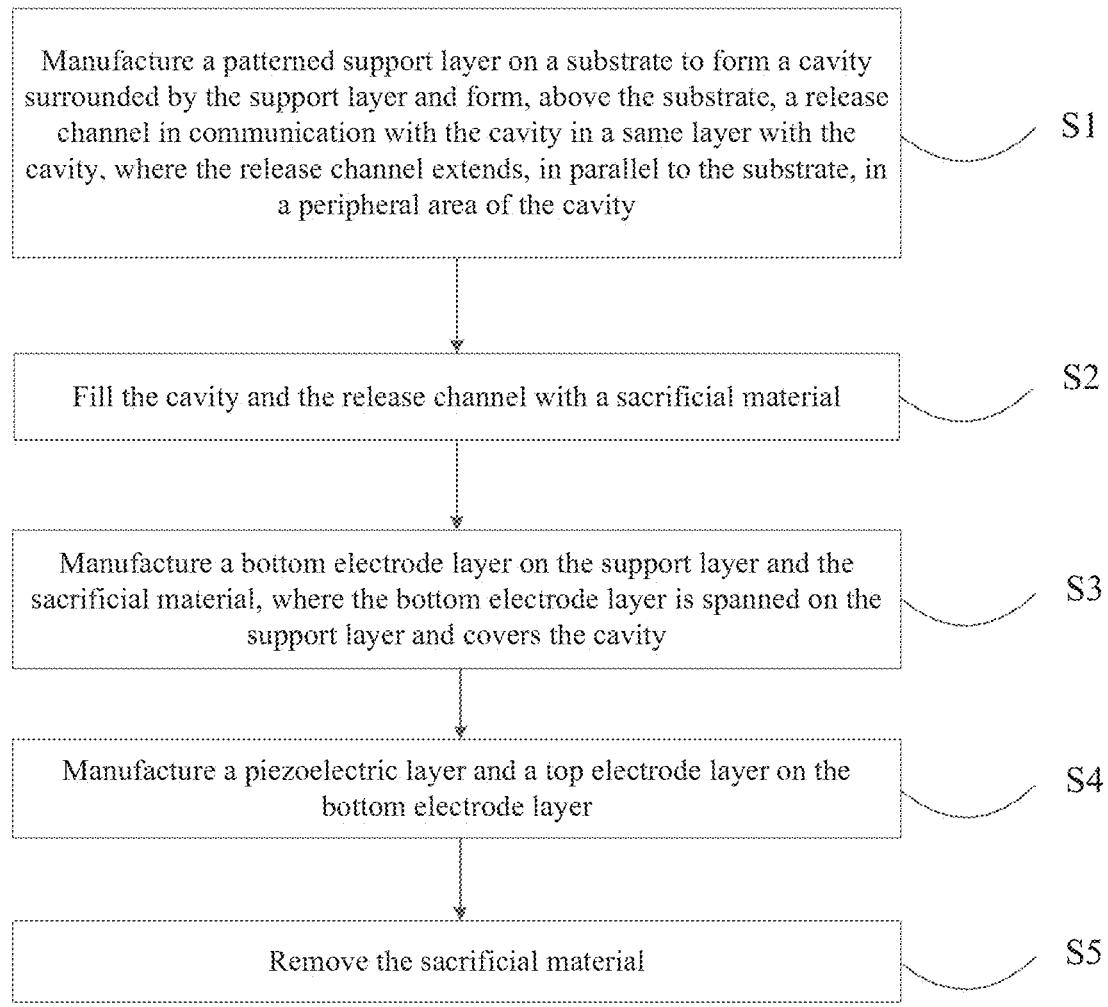
FIG. 5 shows a flowchart of a process for manufacturing a cavity structure of a bulk acoustic resonator according to an embodiment of the present disclosure.

In correspondence to the cavity structure of the bulk acoustic resonator according to the above embodiments, a process for manufacturing a cavity structure of a bulk acoustic resonator is further provided according to an embodiment of the present disclosure. As shown in FIG. 5, the process includes the following steps S1 to S5.

In step S1, a patterned support layer is manufactured on a substrate to form a cavity surrounded by the support layer and a release channel in communication with the cavity is formed above the substrate in the same layer with the cavity, where the release channel extends, in parallel to the substrate, in a peripheral area of the cavity.

In step S2, the cavity and the release channel are filled with a sacrificial material.

In step S3, a bottom electrode layer is manufactured on the support layer and the sacrificial material, where the bottom electrode layer is spanned on the support layer and covers the cavity.

In step S4, a piezoelectric layer and a top electrode layer are manufactured on the bottom electrode layer.

In step S5, the sacrificial material is removed.

In a specific embodiment, FIG. 6a to FIG. 6h and FIG. 3a each is a schematic structural diagram of the process for manufacturing the cavity structure of the bulk acoustic resonator. Step S1 further includes patterning the support layer 301 in a peripheral area of a filter formed by the multiple resonators being connected, to form a groove 501 in communication with the release channel 401. The groove 501 may be in communication with all the release channel 401, thereby avoiding weakening the performance of the resonator due to damage to the structure of the piezoelectric layer 701 around the electrode layer when manufacturing a release hole (a hole in an AlN film layer). In other embodiments, other methods other than the groove 501 may be selected to inject the release liquid into the release channel 401 to release the cavity 201.

Figure 6A:
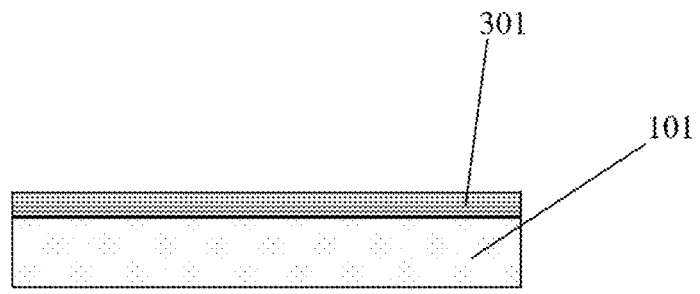
FIG. 6a to FIG. 6h each shows a structural schematic diagram of a process for manufacturing a cavity structure of a bulk acoustic resonator according to an embodiment of the present disclosure.
Figure 6B:
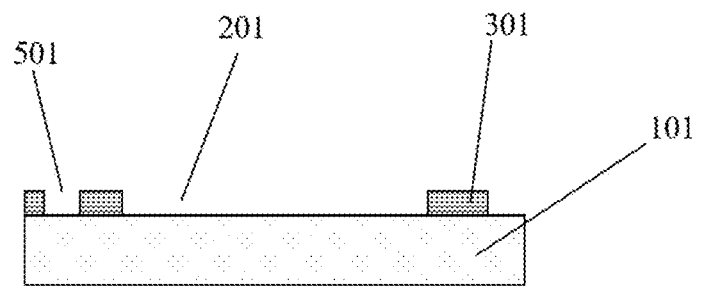
Figure 6C:
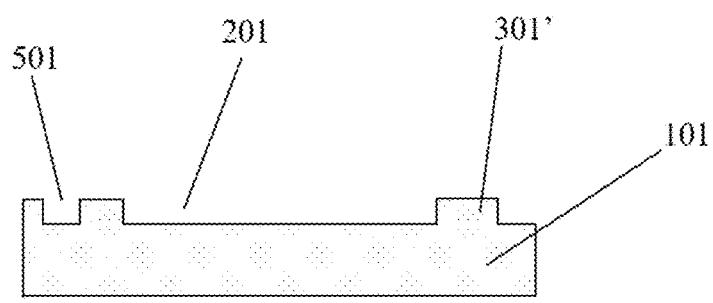

In one embodiment, as shown in FIG. 6a and FIG. 6b, step S1 specifically includes: depositing a support layer 301 on the substrate 101 through a PVD process, and patterning the support layer 301 through photolithography and etching processes. Si may be selected as the material of the support layer 301, where the material of the substrate 101 includes Si/SiC/sapphire/spinel or the like. The PVD-grown support layer 301 has a thickness of 1.5 µm to 3 µm. The support layer 301 is deposited above the substrate 101 by the processes to form the groove 501, the release channel 401 and the cavity 201 in a patterning manner, in the embodiment of the present disclosure, Si is used as the support layer 301, PSG is used as the sacrificial material, and HF or BOE is used as an etchant (a release liquid) of the sacrificial material. The selection of materials will not affect the electrode layer and the piezoelectric layer 701, and the process is simple, and the material is universal and relatively inexpensive, so the process has higher cost performance and process compatibility. In another embodiment, as shown in FIG. 6c, the step S1 specifically includes: forming a patterned support layer 301' on the substrate 101 through an etching process. Since the groove 501, the release channel 401 and the cavity 201 are formed in a patterning manner by etching directly on the substrate 101 through the process, no deposition process is required, and the process is more simplified. In the embodiment of the present disclosure, Si may be selected as the material of the substrate 101, Si may be etched to form a support layer 301' made of the same material as Si. In this case, PSG is selected as the sacrificial material, and HF or BOE is selected as the etchant (the release liquid) for the sacrificial material. The selection of materials will not affect the electrode layer and the piezoelectric layer 701, and the process is simple, the material is universal and relatively inexpensive, so the process has higher cost performance and process compatibility.

Figure 6D:
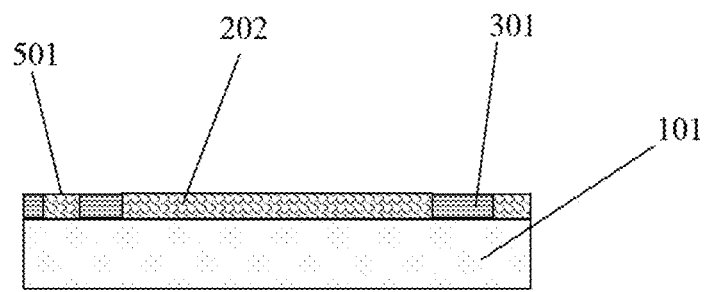

In step S2, as shown in FIG. 6d, the sacrificial material 202 is grown in the groove 501, the release channel 401 and the cavity 201, followed by CMP (chemical mechanical polishing) polishing. The sacrificial material 202 is PSG (Moped SiO$_2$), and the release channel 401 criss-crossed in a peripheral area of the cavity 201 and in communication to the cavity 201 may be used to release the sacrificial material 202 in the cavity 201 without affecting the stress of the piezoelectric layer 701 around the electrode layer of the resonator, thereby improving the performance of the resonator, and avoiding weakening the performance of the resonator due to damage to the structure the piezoelectric layer 701 around the electrode layer when manufacturing a release hole (a hole on the AlN film layer) in the conventional process. The release liquid used fir the sacrificial material 202 may flow into the cavity 201 from the release channel 401 to release the cavity 201.

In a specific embodiment, the release channel 401 includes a first release channel 402 extending outward from the cavity 201 and a second release channel 403 extending among cavities 201 of multiple resonators to be in communication with the first release channel 402. The first release channel 402 and the second release channel 403 are criss-crossed in a peripheral area of cavities 201 of multiple resonators to ensure that the release liquid can flow from the first release channel 402 and the second release channel 403 to the cavity 201 to quickly scarify the sacrificial material 202, and to ensure that the stress uniformity of the piezoelectric layer 701 will not be affected. In a preferred embodiment, the criss-crossed release channels 401 may be designed based on the distribution of the resonators. In this case, there is no need to manufacture the release hole and the process for manufacturing the resonator can be simplified.

In a specific embodiment, a projection of the first release channel 402 and/or the second release channel 403 on the substrate 101 is of a shape of a trapezoid, an arc or a rectangle. The shape of the projection, when viewed from the top view, includes, but is not limited to, a trapezoid, an arc, or a rectangle. By changing the shape of the first release channel 402 and/or the second release channel 403 around the electrode layer, the stress of the piezoelectric layer 701 covering on the first release channel 402 and/or the second release channel 403 is adjusted, thereby effectively improving the performance of the resonator. Since the stress of the piezoelectric layer 701 around the electrode layer will affect a resonance area above the cavity 201, the performance of the resonator can be improved by adjusting the stress of the piezoelectric layer 701 around the electrode layer.

In a specific embodiment, a filter is formed by multiple resonators being connected, and a groove 501 in communication with the release channel 401 is formed on the support layer 301 in a peripheral area of the filter. One end of all of the release channels 401 may be in communication to the groove 501, and the other end may be in communication to the cavity 201, thereby avoiding weakening the performance of the resonator due to damage to the structure of the piezoelectric layer 701 around the electrode layer when manufacturing a release hole (a hole in an AlN film layer). In a preferred embodiment, the groove 501 is a channel without a film covering on top. The release liquid may be directly injected from the groove 501 and then circulated from the release channel 401 into the cavity 201. Therefore, in the present disclosure, it is not necessary to manufacture a release hole around the electrode layer, and the cavity 201 can be released by communicating the internal criss-crossed release channels 401 with the groove 501.

In a specific embodiment, the release channel 401 is a channel extends between the substrate 101 and the piezoelectric layer 701. Different from the use of the release hole extending longitudinally through the electrode layer and the piezoelectric layer to the substrate in the conventional technology, the release channel 401 extends laterally between the substrate 101 and the piezoelectric layer 701, so that the release liquid can flow through the release channel 401. In addition, the cavity 201 is also formed on the substrate 101. In this case, the bottom surface of the release channel 401 and the bottom surface of the cavity 201 are flush, therefore, the release liquid can flow to the release channel 401 and the cavity 201 more quickly and conveniently through the fluidity.

Figure 6E:
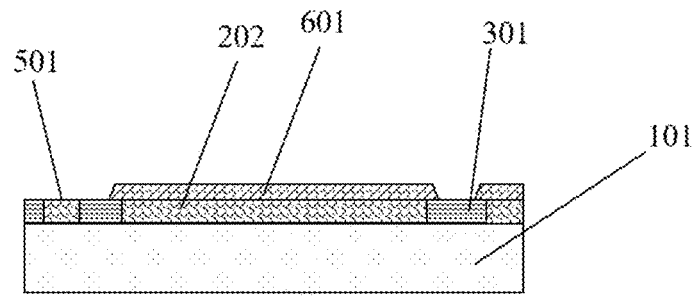
Figure 6F:
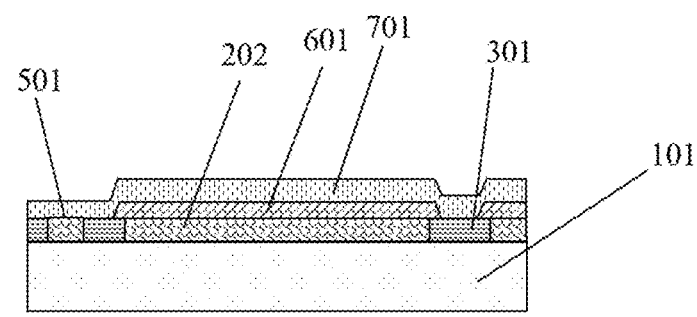
Figure 6G:
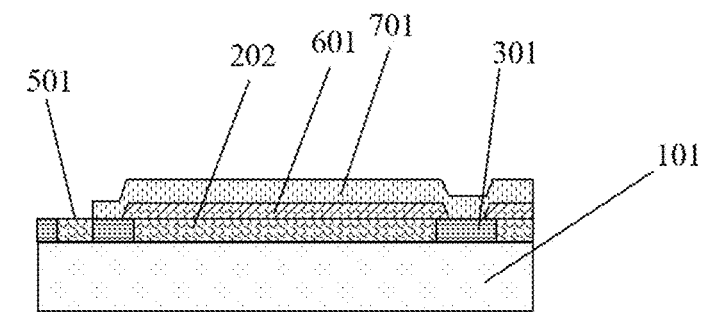
Figure 6H:
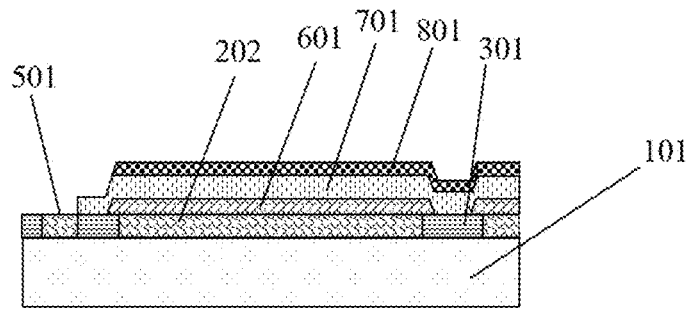

In a specific embodiment, as shown in FIG. 6e, the bottom electrode layer 601 is manufactured by PVD, photolithography and etching processes in sequence. The material of the bottom electrode layer 601 includes Mo. As shown in FIG. 6f, the piezoelectric layer 701 is manufactured by PVD, photolithography and etching processes in sequence. The material of the piezoelectric layer 701 includes AlN, and an etching area of the piezoelectric layer is an area above the groove 501, as shown in FIG. 6g. As shown in FIG. 6h, the top electrode layer 801 is manufactured by PVD, photolithography and etching processes in sequence. The material of the top electrode layer 801 includes Mo.

In a specific embodiment, S5 further includes: forming a release hole 901 on the support layer 301 and the piezoelectric layer 701 in an area away from the bottom electrode layer 601 and the top electrode layer 801 of the resonator, where the release hole 901 extends downward to the substrate 101 and is in communication with at least one of the release channel 401. In terms of too many criss-crossed release channels 401, the release hole 901 is added, and a release efficiency of the cavity 201 can be improved by injecting the release liquid into the release hole 901, so that the cavity 201 can be released more quickly. In addition, the release hole 901 is thrilled in the area away from the bottom electrode layer 601 and the top electrode layer 801 of the resonator, which will not affect the stress of the piezoelectric layer 701 around the electrode layer, and not weaken the performance of the resonator. In a preferred embodiment, the distances between the release hole 901 and the bottom electrode layer 601 and the top electrode layer 801 of the resonator are equal to or greater than 5 μm. The release hole 901 manufactured at the distances will not affect the stress of the piezoelectric layer 701 around the electrode layer.

Finally, as shown in FIG. 3a, by adding the release liquid into the groove 501 or the release hole 901, the release liquid flows into the release channel 401, and finally flows into the cavity 201 to release the cavity 201.

A cavity structure of a bulk acoustic resonator and a process for manufacturing the same are disclosed in the present disclosure. By manufacturing, on the support layer, the release channel in communication with the cavity, the groove in communication with the release channel is arranged in a peripheral area of a filter formed by multiple resonators being connected, where the criss-crossed release channels may be designed based on the distribution of the resonators. In addition, there is no need to manufacture a release hole, which simplifies the manufacturing process of the resonator, thereby avoiding weakening the performance of the resonator due to damage to the structure of the piezoelectric layer around the electrode layer when manufacturing a release hole (a hole in an AlN film layer), The performance of the resonator can be improved by designing a shape of the release channel around the electrode layer and adjusting the stress of the piezoelectric layer around the electrode layer. Therefore, the cavity can be released without damaging the structure of the piezoelectric layer, and the stress of the piezoelectric layer can be adjusted through the design of the cavity structure.

The specific embodiments of the present disclosure have been described above, but the protection scope of the present disclosure is not limited to this. Changes or substitutions may be easily envisaged by those familiar with the technical field within the technical scope disclosed in the present disclosure, and should be included in the protection scope of the present disclosure. Therefore, the protection scope of the present disclosure should be subject to the protection scope of the claims.

In the description of the present disclosure, it should be noted that the orientation or positional relationship indicated by the terms, such as "upper", "lower", "inner", and "outer", are based on the orientation or positional relationship shown in the drawings, which are only to facilitate the description of the present disclosure and to simplify the description, rather than indicating or implying that the device or element referred to must have a specific orientation, or can only be configured and operated in a particular orientation. Therefore the above-mentioned terms should not be construed as a limitation to the present disclosure. The wording 'including' does not exclude the presence of elements or steps not listed in a claim. The preceding wording 'a' or 'an' of an element does not exclude the existence of multiple such elements. The mere fact that certain measures are recited in mutually different dependent claims does not indicate that a combination of these measures cannot be used to advantage. Any reference signs in the claims should not be construed as limiting the scope.

INDUSTRIAL APPLICABILITY

In the embodiments of the present disclosure, the release channel in communication with the cavity are manufactured on the support layer, and the groove in communication with the release channel is arranged in a peripheral area of a filter formed by multiple resonators being connected, where the criss-crossed release channel may be arranged based on the distribution of the resonators. In addition, there is no need to manufacture a release hole, which simplifies the process for manufacturing the resonator, thereby avoiding weakening the performance of the resonator due to damage to the structure of the piezoelectric layer around the electrode layer when manufacturing a release hole (a hole in an AlN film layer). The manufacturing process is simple, the manufacturing cost is low, which facilitates industrial production in large-scale.

The invention claimed is:

1. A bulk acoustic resonator, comprising:
a bottom electrode layer, a piezoelectric layer and a top electrode layer sequentially stacked and formed above a cavity;
wherein the bottom electrode layer is spanned on a support layer;
wherein the bulk acoustic resonator further comprises a cavity structure, the cavity structure comprises a substrate and a cavity formed on the substrate, the support layer is arranged on the substrate to form the cavity in a surrounding manner, a release channel in communication with the cavity is formed above the substrate in a same layer with the cavity, the release channel extends in a peripheral area of the cavity in parallel to the substrate, and the release channel extends laterally between the substrate and the piezoelectric layer and is configured to release a sacrificial material of the cavity;
wherein the release channel comprises a first release channel and a second release channel, the first release channel is configured to be in communication with the cavity and extend outward from the cavity, and the second release channel is configured to be in communication with the first release channel and extend among cavities of a plurality of resonators;
wherein the second release channel is criss-crossed in the peripheral area of the cavity; and
wherein a groove in communication with the release channel is formed on the substrate in a peripheral area of a filter formed by a plurality of resonators being connected, and the groove is a channel without a film covering on top.

2. The bulk acoustic resonator according to claim 1, wherein a release hole is arranged in an area away from the bottom electrode layer and the top electrode layer of the resonator, and the release hole is in communication with at least one of the release channel.

3. The bulk acoustic resonator according to claim 1, wherein a projection of the first release channel and/or the second release channel on the substrate is of a shape of a trapezoid, an arc or a rectangle.

4. A cavity structure of a bulk acoustic resonator, comprising:
a substrate; and
a cavity formed on the substrate;
wherein a support layer is arranged on the substrate to form the cavity in a surrounding manner, a release channel in communication with the cavity is formed above the substrate in a same layer with the cavity, the release channel extends in a peripheral area of the cavity in parallel to the substrate, and the release channel extends laterally between the substrate and a piezoelectric layer and is configured to release a sacrificial material of the cavity;
wherein the release channel comprises a first release channel and a second release channel, the first release channel is configured to be in communication with the cavity and extend outward from the cavity, and the second release channel is configured to be in communication with the first release channel and extend among cavities of a plurality of resonators;

wherein the second release channel is criss-crossed in the peripheral area of the cavity; and wherein a groove in communication with the release channel is formed on the substrate in a peripheral area of a filter formed by a plurality of resonators being connected, and the groove is a channel without a film covering on top.

5. The cavity structure of a bulk acoustic resonator according to claim 4, wherein a projection of the first release channel and/or the second release channel on the substrate is of a shape of a trapezoid, an arc or a rectangle.

6. A method for manufacturing a cavity structure of a bulk acoustic resonator, comprising:

S1, manufacturing a patterned support layer on a substrate to form a cavity surrounded by the support layer, and forming, above the substrate, a release channel in communication with the cavity in a same layer with the cavity, wherein the release channel extends, in parallel to the substrate, in a peripheral area of the cavity, the release channel comprises a first release channel and a second release channel, the first release channel is configured to be in communication with the cavity and extend outward from the cavity, the second release channel is configured to be in communication with the first release channel and extend among cavities of a plurality of resonators, and the second release channel is criss-crossed in the peripheral area of the cavity;

S2, filling the cavity and the release channel with a sacrificial material;

S3, manufacturing a bottom electrode layer on the support layer and the sacrificial material, wherein the bottom electrode layer is spanned on the support layer and covers the cavity;

S4, manufacturing a piezoelectric layer and a top electrode layer on the bottom electrode layer; and S5, removing the sacrificial material by using the release channel, wherein the release channel extends laterally between the substrate and the piezoelectric layer, wherein the step S1 further comprises:

patterning the substrate in a peripheral area of a filter formed by a plurality of resonators being connected, to form a groove in communication with the release channel, and the groove is a channel without a film covering on top.

7. The method for manufacturing a cavity structure of a bulk acoustic resonator according to claim 6, wherein a projection of the first release channel and/or the second release channel on the substrate is of a shape of a trapezoid, an arc or a rectangle.

8. The method for manufacturing a cavity structure of a bulk acoustic resonator according to claim 6, wherein the step S2 further comprises:

filling the groove with the sacrificial material.

9. The method for manufacturing a cavity structure of a bulk acoustic resonator according to claim 6, wherein the step S1 comprises:

depositing the support layer on the substrate through a PVD process, and patterning the support layer through photolithography and etching processes.

10. The method for manufacturing a cavity structure of a bulk acoustic resonator according to claim 6, wherein the step S1 comprises:

forming a patterned support layer on the substrate through an etching process.

11. The method for manufacturing a cavity structure of a bulk acoustic resonator according to claim 6, wherein a surface of the sacrificial material and a surface of the support layer are made flush through a polishing step in the step S2.

12. The method for manufacturing a cavity structure of a bulk acoustic resonator according to claim 6, wherein the step S5 further comprises:

manufacturing a release hole on the support layer and the piezoelectric layer in an area away from the bottom electrode layer and the top electrode layer of the resonator, wherein the release hole extends downward to the substrate and is communication with at least one of the release channel.

* * * * *